(12) United States Patent
Iwasa

(10) Patent No.: US 6,470,473 B1
(45) Date of Patent: Oct. 22, 2002

(54) DATA DECODING PROCESSING SYSTEM AND METHOD

(75) Inventor: Ayaka Iwasa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/449,470

(22) Filed: Nov. 29, 1999

(30) Foreign Application Priority Data

Nov. 27, 1998 (JP) .......................................... 10-336717

(51) Int. Cl.[7] .............................................. H03M 13/00
(52) U.S. Cl. ................................................... 714/785
(58) Field of Search .......................... 714/758, 763–768, 714/781, 785

(56) References Cited

U.S. PATENT DOCUMENTS

| | | | | |
|---|---|---|---|---|
| 5,933,436 A | * | 8/1999 | Tanzawa et al. | 365/200 |
| 6,048,090 A | * | 4/2000 | Zook | 714/755 |
| 6,058,499 A | * | 5/2000 | Sim | 714/746 |
| 6,061,760 A | * | 5/2000 | Huang | 711/105 |
| 6,141,787 A | * | 10/2000 | Kunisa et al. | 341/58 |
| 6,167,551 A | * | 12/2000 | Nguyen et al. | 714/770 |

FOREIGN PATENT DOCUMENTS

| | | |
|---|---|---|
| JP | 07-312037 | 11/1995 |
| JP | 9-265730 | 10/1997 |
| JP | 10-126279 | 5/1998 |
| JP | 10-229344 | 8/1998 |

OTHER PUBLICATIONS

Japanese Office Action, dated May 8, 2001, with English language translation of Japanese Examiner's comments.

* cited by examiner

*Primary Examiner*—Albert Decady
*Assistant Examiner*—Cynthia Harris
(74) *Attorney, Agent, or Firm*—Whitham, Curtis & Christofferson, PC

(57) ABSTRACT

A DVD-ROM data decoding processing system includes a DVD-ROM reproducing unit 32 and a buffer memory 34. The DVD-ROM reproducing unit 32 includes a demodulating part 36, a PI syndrome generating part 38, an error correcting part 40, a buffer memory 42 having a memory capacity corresponding to a few lines, a PO syndrome generating part 44, a descrambling/EDC calculating part 46, a PI syndrome storing memory 48, a PO syndrome storing memory 50, an EDC calculation result storing memory 52, an error correcting part 54, and a CPU 56. The error correcting part 40 derives the position and the magnitude of errors in the PI series from the PI syndromes generated in the PI syndrome generating part 38, and corrects the data errors in the buffer memory 42 on the basis of the position and the magnitude of errors in the PI series, interleave by interleave. The error correcting part 54 reads out the PO syndromes of one block the PO syndrome storing memory 50, to derive the position and the magnitude of errors in the PO series, and to correct the data errors in the buffer memory 34 on the basis of the position and the magnitude of errors in the PO series thus derived.

10 Claims, 8 Drawing Sheets

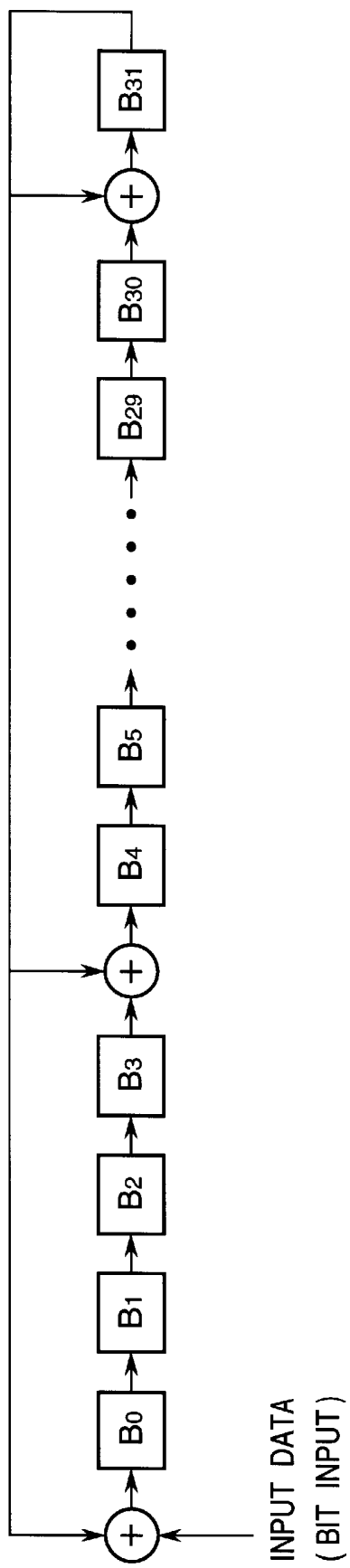

DATA DECODING PROCESSING SYSTEM AND METHOD

BACKGROUND OF THE INVENTION

The present invention relates to a data decoding processing system and method, and more specifically to a data decoding processing system and method for decoding a digital video signal with a shortened processing time.

When a digital video signal is stored in a DVD-ROM (digital video disk—read only memory), an encoding of data for DVD-ROM (generation of a physical sector from a logic sector) is conventionally performed by a procedure in that (1) an error detecting code (EDC) is added; (2) a main data is scrambled; and (3) an error correcting code (ECC) is added as a PO (parity of outer code) series and a PI (parity of inner code) series. Accordingly, in a data decoding system, a procedure reverse to the encoding is performed. Namely, (1) syndromes of the PI series and the PO series are calculated for error correction; (2) a descrambling is performed for the main data; and (3) the EDC checking is performed.

Referring to FIG. 1, there is shown a prior art data decoding processing system for carrying out the above mentioned processing. However, before explaining the system, a format of data stored in the DVD-ROM (disk) will be described with reference to FIGS. 2A and 2B. As shown in FIG. 2A illustrating a data format of one sector after scrambled, one sector is composed of 12 lines (172 bytes per line) and includes a scrambled main data of 2048 bytes, which is added at a heading with ID of 4 bytes and others and at an ending with EDC of 4 bytes. As shown in FIG. 2B, one ECC block includes 16 data sectors, PO error correcting codes (16 lines) added to the 16 data sectors in a column direction designated by the encircled reference number 1, and PI error correcting codes (10 bytes) added to the 16 data sectors and the PO error correcting codes of 16 lines, in a row direction designated by the encircled reference number 2.

Returning to FIG. 1, the shown DVD-ROM data decoding processing system, designated with the reference number 10, includes a DVD-ROM reproducing unit 11 and a buffer memory 12. In the DVD-ROM reproducing unit 11, a demodulator 16 receives data read out from a disk 14 to demodulate the received data and to develop the demodulated data in the buffer memory, as shown by the encircled reference number 1. A syndrome generator 18 read out data from the buffer memory 12 as shown by the encircled reference number 2, and generates syndromes. On the basis of the generated syndromes, an error correcting circuit 20 performs an error correction to the data in the buffer memory 12, as shown by the encircled reference number 3. A descrambling/EDC checking circuit 22 reads out the error corrected data from the buffer memory 12, as shown by the encircled reference number 4, and performs the descrambling processing and the EDC checking to write the descrambled data into the buffer memory 12, as shown by the encircled reference number 5. Thus, the decoding is completed. A CPU (central processing unit) 24 controls an operation of the above mentioned various parts, and receives the result of the EDC checking to recognize the completion of the decoding.

Thereafter, a host computer (not shown) reads out necessary data from the buffer memory 12.

In the above mentioned prior art DVD-ROM data decoding processing system, when the syndromes are generated, and when the descrambling processing and the EDC checking are executed, all of the data of one block are read out from the buffer memory, and therefore, the number of accesses to the buffer memory inevitably becomes large. As a result, a scrabble for an access authority occurs between the DVD-ROM reproducing unit and another processing which needs to access the buffer memory (for example, transfering to a host interface). This scrabble becomes a bottleneck so that a high speed processing of the overall system is hindered. Furthermore, since the number of accesses to the buffer memory is large, the processing time for the data decoding becomes long.

In order to reduce the number of accesses to the buffer memory, Japanese Patent Application Pre-examination Publication No JP-A-09-265730, (an English abstract of JP-A-09-265730 is available from the Japanese Patent Office and the content of the English abstract of JP-A-09-265730 is incorporated by reference in its entirety into this application) proposes to transfer data into an internal buffer memory once, and to access to the internal buffer memory. However, if this proposal is adopted, since the DVD-ROM data decoding processing system requires a memory having a memory capacity of one block (32 Kbytes), a circuit scale inevitably becomes large.

Furthermore, Japanese Patent Application Pre-examination Publication No. JP-A-10-126279, (an English abstract of JP-A-10-126279 is available from the Japanese Patent Office and the content of the English abstract of JP-A-10-126279 is incorporated by reference in its entirety into this application) proposes to supply the data read out from the buffer memory, to a syndrome calculator, and to simultaneously supply the read-out data to a descrambler so that an error correction is performed for the descrambled data, whereby the number of accesses to the buffer memory is reduced. In this proposed technology, however, when the correction is performed a plurality of times, it becomes necessary to access the buffer memory at each time the correction is performed. Accordingly, in a reproducing method needing the correction of plural times, the number of accesses to the buffer memory is still not reduced.

BRIEF SUMMARY OF THE INVENTION

Accordingly, it is an object of the present invention to provide a data decoding processing system and method which has overcome the above mentioned defect of the conventional one.

Another object of the present invention is to provide a data decoding processing system and method, capable of reducing the number of accesses to the buffer memory when the correction is performed a plurality of times, thereby to shorten the data decoding processing time.

The error correction requires the processing of two steps which includes (1) the step of generating the syndromes and (2) the step of seeking the position and the magnitude of an error(s) from the generated syndromes to perform the correction processing. According to the DVD-ROM format, the error correction in the decoding processing is performed for the data before descrambled. Here, the scrambling/descrambling is that a scramble data is added to each data by means of an exclusive-OR. In addition, the scrambling processing is unambiguously determined by the position of the data, but does not depend upon the value of the data. Accordingly, the existence/nonexistence of an error gives no influence on the descrambling. Therefore, the generation of the syndromes is required to be performed for the data before descrambled, however, the result of the error correction is the same, independently of whether the error correction is performed for the data before descrambled or for the data after descrambled.

As mentioned above, it is required that the syndromes are generated on the basis of the data before descrambled. If the error correction is performed only one time, it is unnecessary to store and revise the syndrome. When the error correction is repeated a plurality of times as in the DVD-ROM having two error correcting code series of the PI series and the PO series, the revision is required when the syndromes are stored and also when the error correction is performed. The reason for this is that, since the revised data in the buffer memory is the data after descrambled, the syndrome cannot be generated by reading out the data in the buffer memory.

Furthermore, the revision becomes necessary at each time the EDC calculation result is stored and the error is corrected. When all of the error correction is completed, it is possible to obtain the result of the EDC calculation for the data having no error.

The present invention was made on the basis of the above mentioned thought. According to the present invention, there is provided a data decoding processing system for decoding data which is obtained by adding two error correcting code series to a scrambled data added with error detection codes, the data decoding processing system being so configured to generate syndromes of a first series from the data, to perform an error correction of the data on the basis of the generated syndromes of the first series, to store the syndromes of the first series after the error correction, to generate and store syndromes of a second series from the error corrected data and simultaneously to descramble the error corrected data so as to store the descrambled data, to perform an error detecting code calculation for the descrambled data so as to store a the result of the error detecting code calculation, and thereafter on the basis of the stored syndromes of the second series and the stored syndromes of the first series, alternately to perform the error correction of the descrambled data and to revise the stored syndromes of the second series or the stored syndromes of the first series, and to revise the stored result of the error detecting code calculation.

The above and other objects, features and advantages of the present invention will be apparent from the following description of preferred embodiments of the invention with reference to the accompanying drawings.

BRIEF DESCRIPTION OF THE DRAWINGS

FIG. 7 illustrates a construction of an EDC circuit for performing the EDC calculation;

FIG. 10 illustrates an error data series; and

DETAILED DESCRIPTION OF THE INVENTION

Figure 1:
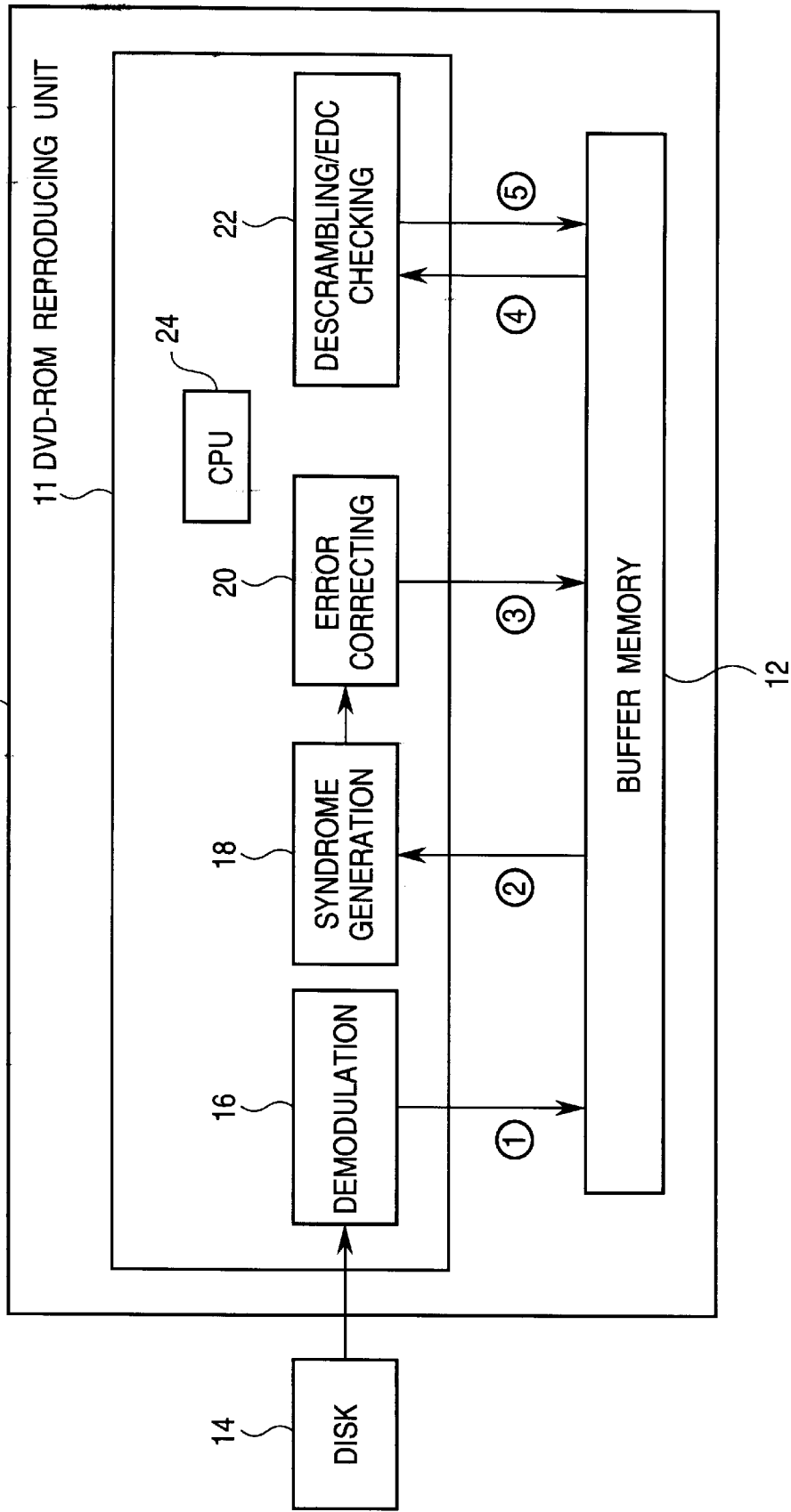
FIG. 1 is a block diagram illustrating a prior art data decoding processing system.
Figure 2A:
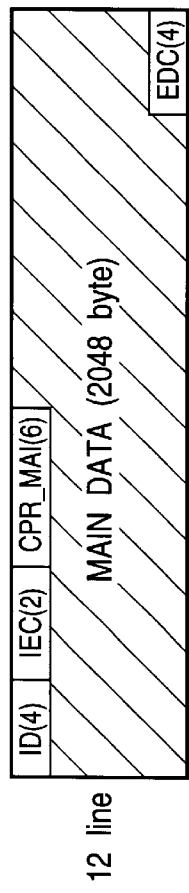
FIG. 2A illustrates a data format of one sector after scrambled.
Figure 2B:
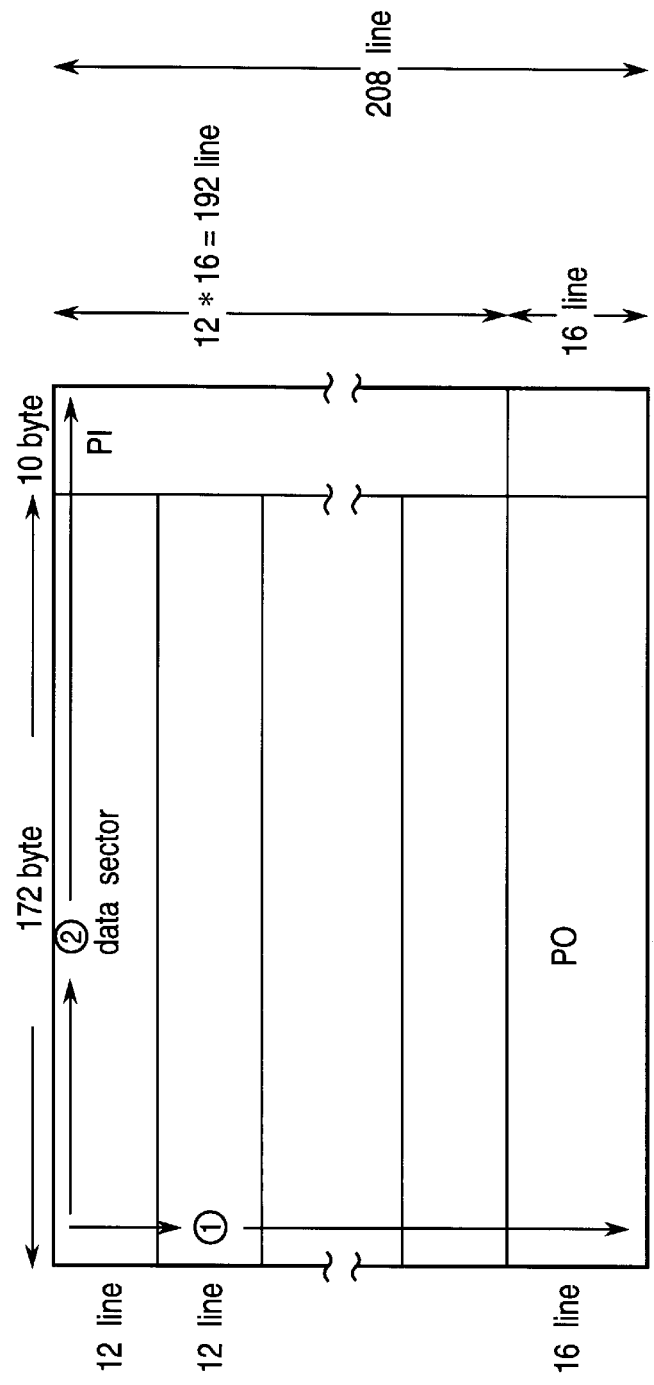
FIG. 2B illustrates a data format of one ECC block.
Figure 3:
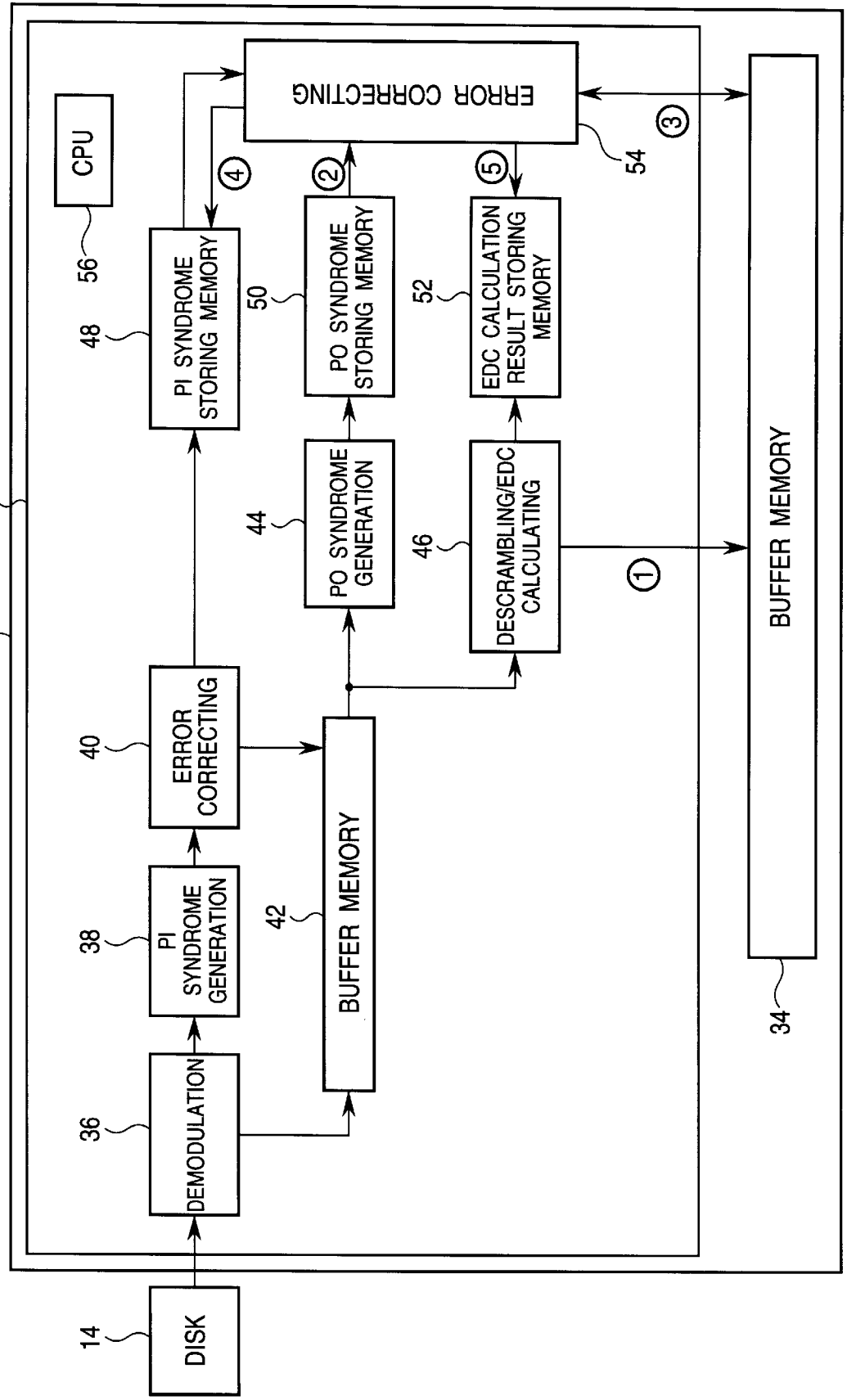
FIG. 3 is a block diagram illustrating an embodiment of the data decoding processing system in accordance with the present invention.

Referring to FIG. 3, there is shown a block diagram illustrating an embodiment of the data decoding processing system in accordance with the present invention, which is designated with the reference number 30 and which is a DVD-ROM data decoding processing system. The shown DVD-ROM data decoding processing system 30 includes a DVD-ROM reproducing unit 32 and a buffer memory 34. The DVD-ROM reproducing unit 32 includes a demodulating part 36, a PI syndrome generating part 38, an error correcting part 40, a buffer memory 42 having a memory capacity corresponding to a few lines, a PO syndrome generating part 44, a descrambling/EDC calculating part 46, a PI syndrome storing memory 48, a PO syndrome storing memory 50, an EDC calculation result storing memory 52, an error correcting part 54, and a CPU 56, which are coupled as shown.

Now, a function and an operation of various parts of the shown reproducing unit 32 will be described with reference to the timing chart of FIG. 4.

Data read out from a DVD-ROM disk 14 is supplied to the demodulator 36 and demodulated by the demodulator 36. The demodulated data is supplied, interleave by interleave, to the PI syndrome generating part 38 and the buffer memory 42. In the buffer memory 42, the demodulated data corresponding to a few lines is stored.

In the PI syndrome generating part 38, syndromes of the PI series are calculated. As mentioned hereinafter, in the PO syndrome generating part 44, syndromes of the PO series are calculated. Here, the calculation of the syndromes will be described.

The syndrome is the coefficients Sj in a syndrome polynomial S(X) defined as follows:

$$S_j = \prod_{ji=1}^{t} E_{ji}(a^j)^{ji}$$

Namely, the syndrome for a received polynomial is obtained by substituting the roots αj of the generator polynomial into the received polynomial. In the PI series, j=0, 1, 2, ..., 9 and t=5 (ECC code number divided by two). In the PO series, j=0, 1, 2, ..., 15 and t=8 (ECC code number divided by two). When the syndromes Sj are generated, if the syndromes Sj are all "0" (zero), it can be discriminated that there is no error. In the other situations, it is discriminated that there is an error. This discrimination will be performed in the CPU 56.

Figure 5:
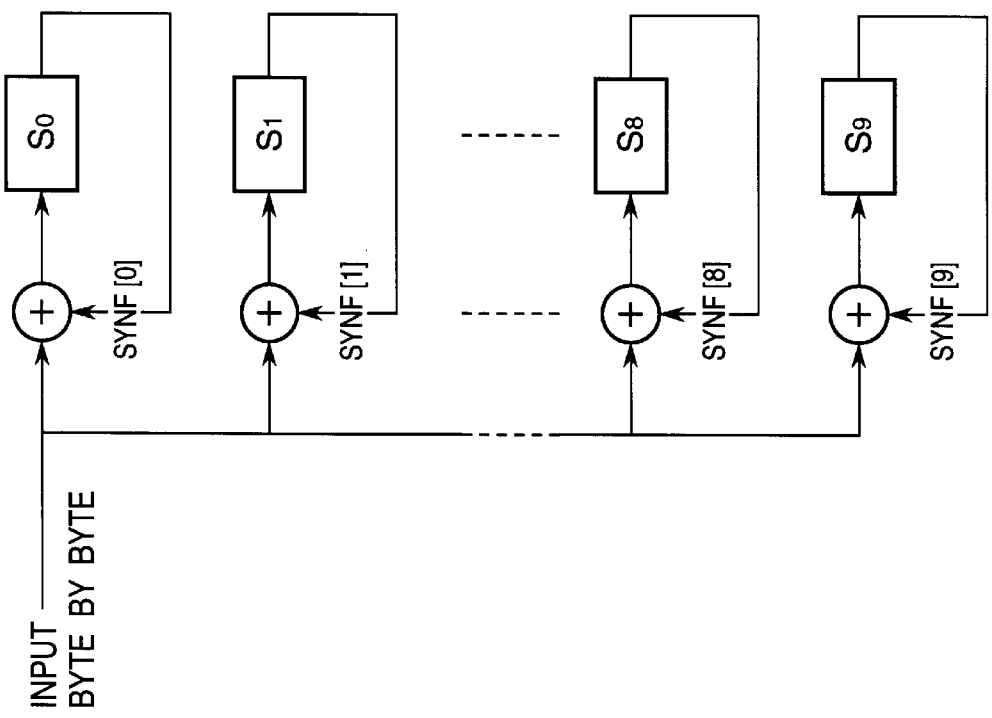
FIG. 5 illustrates a construction of a PI syndrome generating circuit.

Referring to FIG. 5, a construction of the PI syndrome generating circuit 38 is shown. In FIG. 5, "SYNF[n]" indicates execution of a Galois field multiplication. Incidentally, since the method for generating the syndrome is well known to persons skilled in the art, explanation will be omitted.

In the error correcting part 40, the position and the magnitude of an error in the PI series are derived from the PI syndromes generated in the PI syndrome generating part 38, and an data error in the buffer memory 42 is corrected on the basis of the position and the magnitude of the error in the PI series, interleave by interleave. When the errors could have been corrected, the syndrome becomes "0", and the syndrome "0"n is transferred to the PI syndrome storing memory 48. If the errors could not have been corrected, the PI syndromes are transferred without modification to the PI syndrome storing memory 48.

Figure 6:
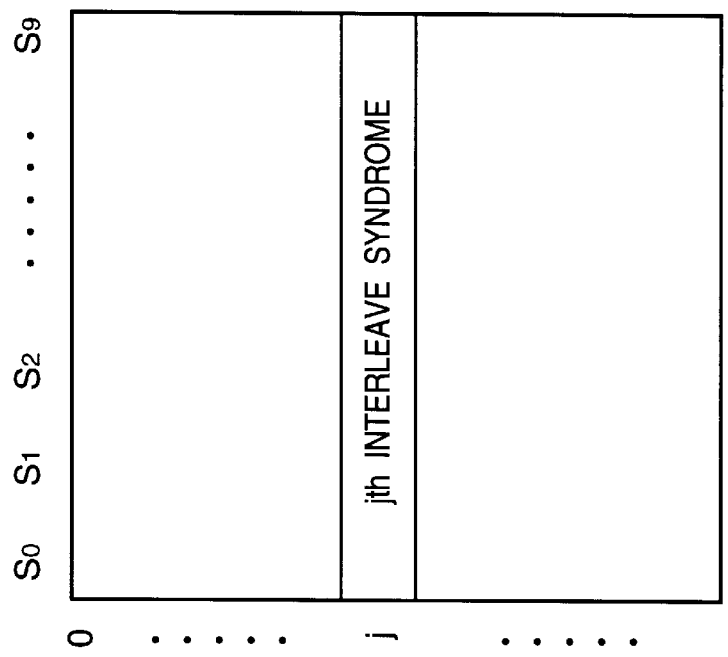
FIG. 6 illustrates a construction of a PI syndrome storing memory.

Referring to FIG. 6, a construction of the PI syndrome storing memory 48 is shown. FIG. 6 illustrates a condition that the PI syndromes $S_0, S_1, \ldots, S_9$ for a jth interleave are stored.

On the other hand, the data read out from the buffer memory 42 is supplied to the descrambling/EDC calculating part 46 and the PO syndrome generating part 44.

In the descrambling/EDC calculating part 46, the data read out from the buffer memory 42 is descrambled, and the descrambled data of one block is developed in the buffer memory 34, as indicated by the encircled reference number 1 in FIG. 3. In the descrambling/EDC calculating part 46, furthermore, the EDC calculation is performed for the descrambled data. Here, assuming that the generator polynomial for EDC is G(x), the remainder obtained by dividing the code series by the generator polynomial G(x) is the result of the calculation of EDC.

Referring to FIG. 7, a construction of an EDC circuit for performing this EDC calculation is shown. This EDC circuit illustrates an example for the DVD EDC generator polynomial $G(x)=X^{32}+X^{31}+X^4+1$, and is composed of one-bit shift circuits and exclusive-OR circuits combined as shown. The position for putting the exclusive-OR circuits is determined by the generator polynomial. In DVD, data is serially supplied to the EDC circuit in the order starting the heading data with the MSB being first. When one sector of data has been inputted, the values of $B_0$ to $B_{31}$ (32 bits =4 bytes) are the EDC calculation result. If the EDC calculation of one block (=16 sectors) has been completed, the EDC calculation result of one block is outputted from the descrambling/EDC calculating part 46, and stored in the EDC calculation result storing memory 52.

Figure 8:
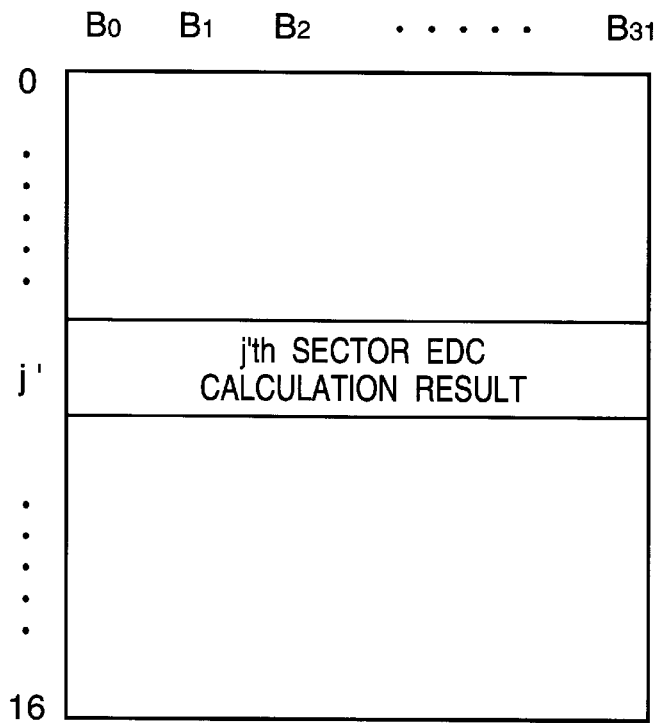
FIG. 8 illustrates a construction of a memory for storing the result of the EDC calculation.

Referring to FIG. 8, a construction of the EDC calculation result storing memory 52 is shown. FIG. 8 illustrates a condition that the EDC calculation result of a j'th sector in one block is stored.

The CPU 56 reads out the calculation result from the EDC calculation result storing memory 52, and discriminates that the data is correct if the sectors $B_0$ to $B_{31}$ are all "0" (zero). Thus, the error correction of one block is completed.

On the other hand, in the PO syndrome generating part 44, the PO syndrome is generated on the basis of the data read out from the buffer memory 42, and the generated PO syndrome of one block is stored in the PO syndrome storing memory 50.

Figure 9:
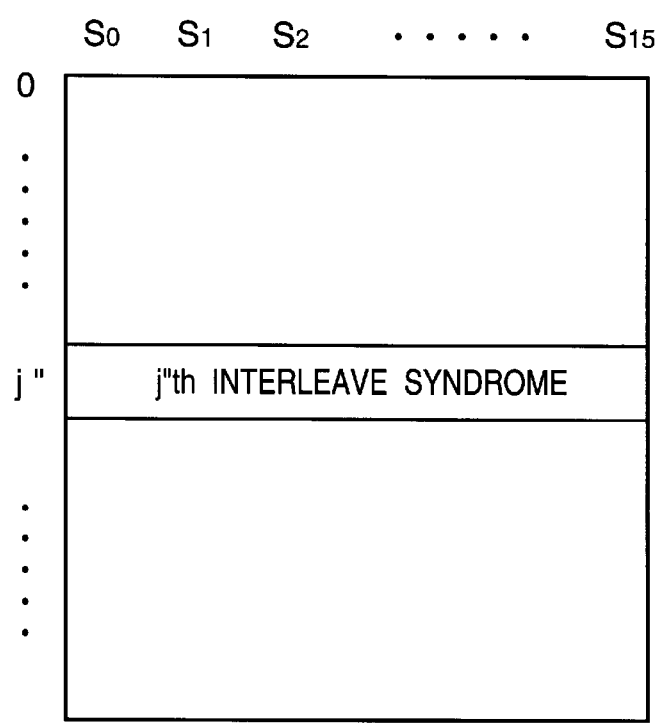
FIG. 9 illustrates a construction of a PO syndrome storing memory.

Referring to FIG. 9, a construction of the PO syndrome storing memory 50 is shown to FIG. 9 illustrates a condition that the PO syndromes $S_0, S_1, \ldots, S_{15}$ of a j"th interleave are stored.

Figure 4:
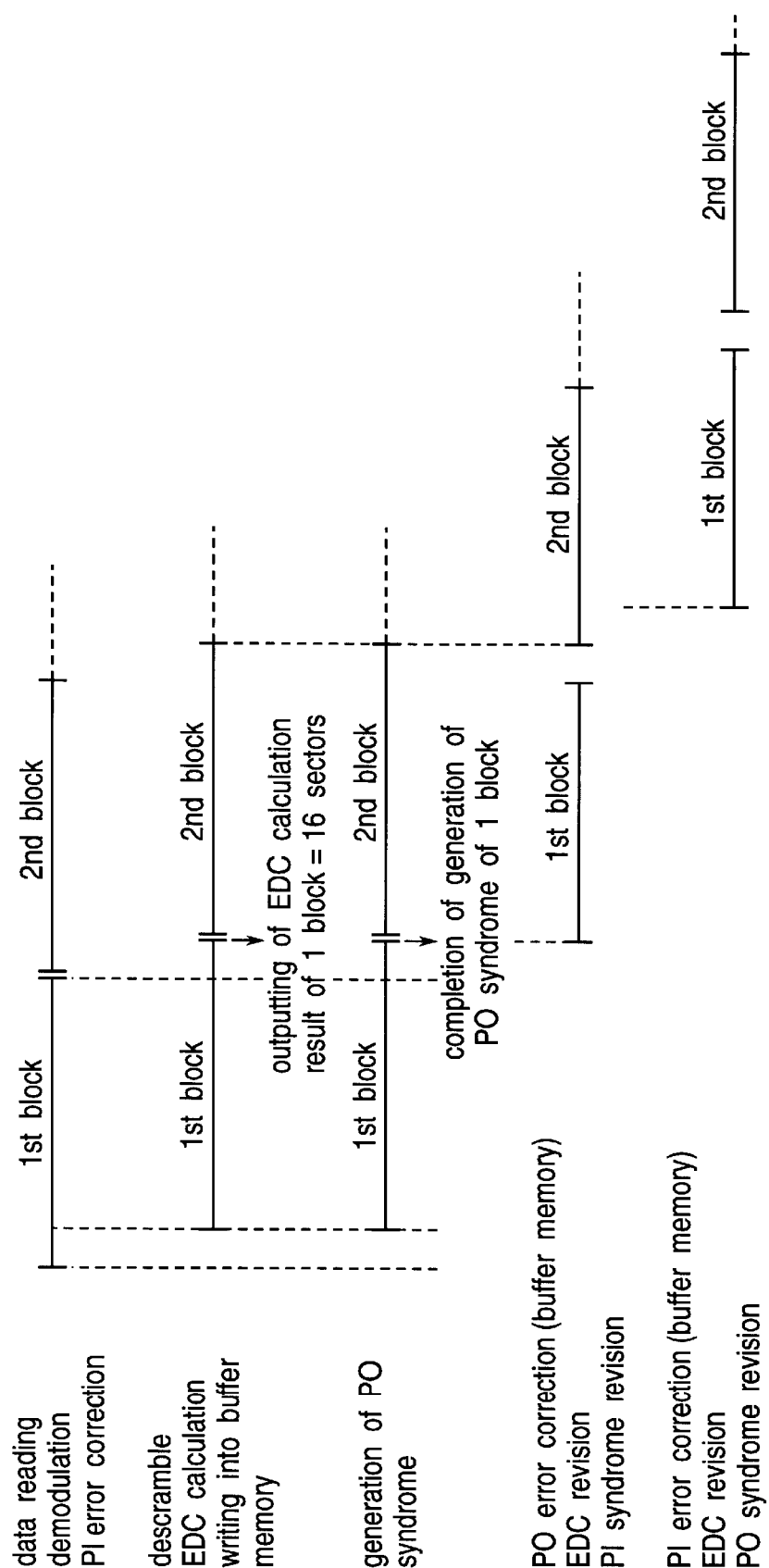
FIG. 4 is a timing chart illustrating an operation of the data decoding processing system shown in FIG. 3.

As shown in the timing chart of FIG. 4, the PI syndrome generation, the PO syndrome generation and the descrambling/EDC calculation, as mentioned above, are performed together, and therefore, the number of accesses to the buffer memory 34 can be reduced in comparison with the prior art.

In the error correcting part 54, the PO syndromes of one block are read out from the PO syndrome storing memory 50, as indicated by the encircled reference number 2 in FIG. 3, so that the position and the magnitude of errors in the PO series are derived, and the data errors in the buffer memory 34 are corrected on the basis of the position and the magnitude of errors in the PO series thus derived, as indicated by the encircled reference number 3 in FIG. 3.

As the result of this error correction, the data in the buffer memory 34 becomes different from the data having the PI series errors which have been corrected by the error correcting part 40. Therefore, it is necessary to revise the PI syndrome stored in the PI syndrome storing memory 48 and the EDC calculation result stored in the EDC calculation result storing memory 52.

Figure 11:
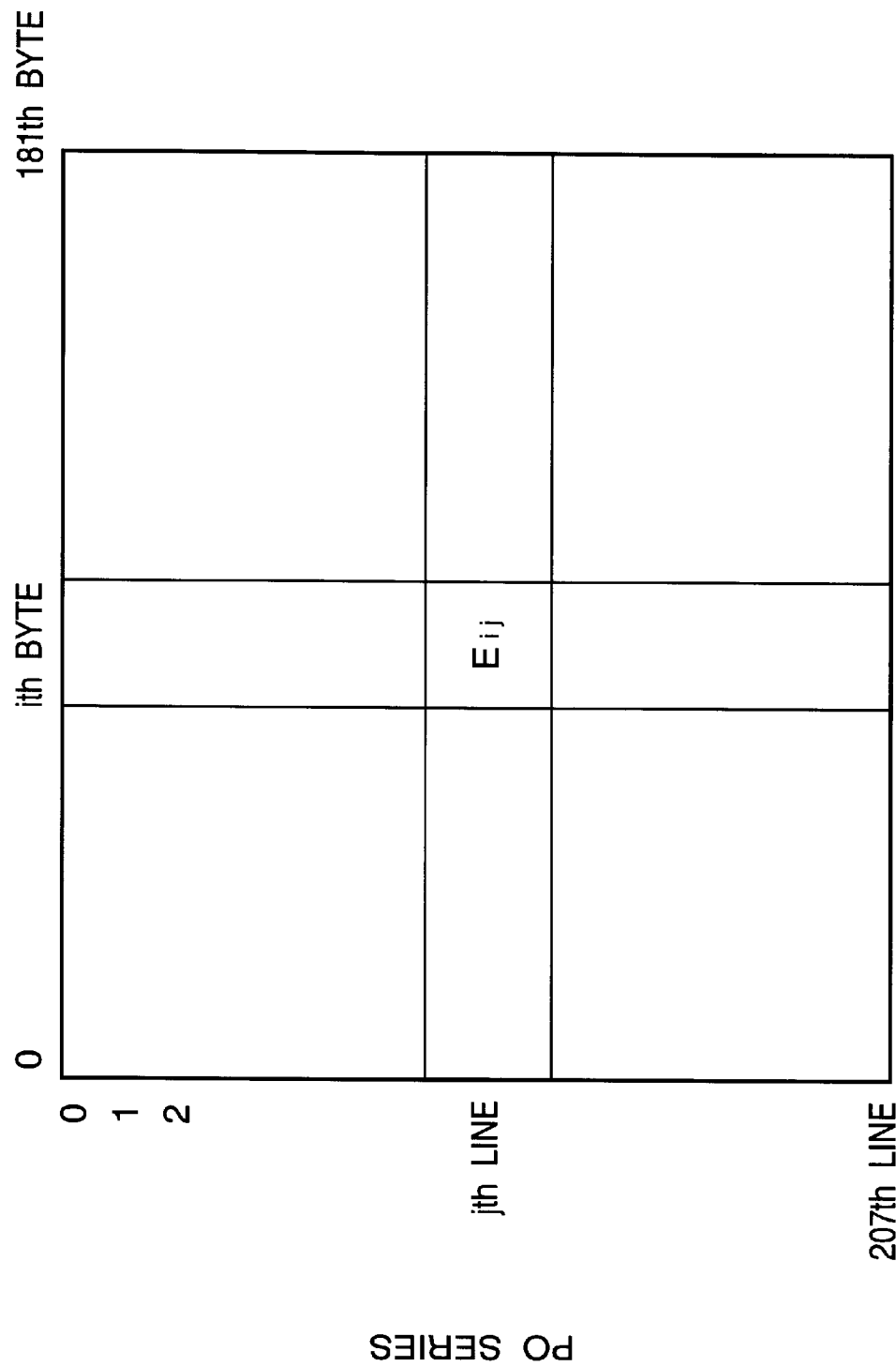
FIG. 11 illustrates a position of the error.

The revision of the PI syndrome as indicated by the encircled reference number 4 in FIG. 3, is performed as follows: It is assumed that, as shown in FIG. 11, a jth code series includes an error Eij on an ith position when the code series are partitioned byte by byte, and the error Eij is recognized by the error correcting part 54. By action of an PI syndrome revision function of the error correcting part 54, the PI syndrome revised value is calculated for the ith series syndrome, and the obtained revised value is added, as a revised value for the jth code series syndrome, to the PI syndrome stored in the PI syndrome storing memory 48 by means of an exclusive OR. Thus, the revision of the PI syndrome has been completed.

On the other hand, the EDC revision as indicated by the encircled reference number 5 in FIG. 3, is performed as follows: It is assumed that the error correcting part 54 detects that an error "1" exists on a position "i" when the code series are partitioned bit by bit. By action of an EDC function of the error correcting part 54, the EDC value for the error data series as shown in FIG. 10 is calculated. Actually, until a first data of "1" is inputted, only data of all "0s" are circulated in the EDC circuit, so that the value does not change. Therefore, after the data of "1" is inputted, the EDC revised value can be obtained by shifting the EDC circuit "i" times (since the inputting of "0" is the same as a simple shifting). If there are a plurality of errors, the EDC revised value for each error is added by an exclusive-OR. The revised value(s) thus obtained are added to the EDC calculation result stored in the EDC calculation result storing memory 52 by means of an exclusive-OR. The value added by means of the exclusive-OR is a final EDC calculation result which has been corrected for the PO error.

The CPU 56 reads out the revised EDC calculation result of one block, and if the revised EDC calculation result is all-zero, the CPU 56 discriminates that the error correction is properly completed and the data stored in the buffer memory 34 is correct. If the revised EDC calculation result is not all-zero, the CPU 56 discriminates that the error correction has not yet been completed, and instructs to the error correcting part 54 to further perform the PI error correction. The error correcting part 54 reads out the revised PI syndrome from the PI syndrome storing memory 48, and corrects the data in the buffer memory 34.

The EDC revision is performed again, and if the revised EDC calculation result is all-zero, the CPU 56 discriminates that the error correction is properly completed and the data stored in the buffer memory 34 is correct. Thus, the CPU 56 terminates the decoding processing. Thereafter, a host computer (not shown) receives a necessary data from the buffer memory 34.

In the above mentioned embodiment, after the PI error correction and the PO error correction, the PI error correction is further performed. The embodiment can be so modified that if an error still exists after the final PI error correction, the PO error correction and the PI error correction are repeated.

The above mentioned embodiment is so configured to decode the data read out from the DVD-ROM. However, it would be apparent to persons skilled in the art that the present invention can be applied not only to the DVD-ROM but also to data of a satellite broadcasting.

As seen from the above, since the number of accesses to the buffer memory by a reproducing processing unit can be reduced, a host side processor can increase the access to the buffer memory, so that a high tranfer rate can be obtained. The following is why the number of accesses to the buffer memory by the reproducing processing unit can be reduced in comparison with the prior art.

The number of accesses when one block is processed, will be examined. In the prior art, (1) Data read out from the disk is written into the buffer memory (data of one block);
(2) Data is read out from the buffer memory for generating the syndrome (data of one block);
(3) For error correction, data is read out from the buffer memory and the corrected data is written to the buffer memory (data of one block);
(4) For descrambling/EDC checking, data is read out from the buffer memory (data of one block); and
(5) The descrambled data is written into the buffer memory.

Therefore, five accesses are performed. On the other hand, in the present invention, (1) The descrambled data is written into the buffer memory (data of one block); and
(2) For error correction, data is read out from the buffer memory and the corrected data is written to the buffer memory (data corresponding to the number of errors)

Therefore, only two accesses are performed.

As mentioned above, according to the present invention, it is possible to reduce the number of accesses to the common buffer memory in comparison with the prior art. The access to the common buffer memory is divided into three, namely, (1) transfer of data from the disk, (2) the access for the decoding processing, and (3) transfer of data to the host processor. Since the number of accesses for the decoding processing can be reduced as mentioned above, the reading speed of the disk and the transfer rate to the host processor can be increased.

Furthermore, according to the present invention, since the syndrome generation and the descrambling/EDC calculation are performed simultaneous, the data reading time of the buffer memory for generating the syndrome and the data reading and writing time of the buffer memory for descrambling/EDC checking are no longer necessary, with the result that the time required for the reproduction is shortened.

The invention has thus been shown and described with reference to the specific embodiments. However, it should be noted that the present invention is in no way limited to the details of the illustrated structures but changes and modifications may be made within the scope of the appended claims.

The content of Japanese Patent Application No. Heisei 10-336717 filed on Nov. 27, 1998 including the specification, claims and drawings, is incorporated by reference in its entirety into this application.

What is claimed is:

1. A data decoding processing system for decoding data which is obtained by adding two error correcting code series to a scrambled data added with error detection codes, the data decoding processing system being so configured to generate syndromes of a first series from said data, to perform an error correction of said data on the basis of the generated syndromes of said first series, to store said syndromes of said first series after the error correction, to generate and store syndromes of a second series from the error corrected data and simultaneously to descramble the error corrected data so as to store the descrambled data, to perform an error detecting code calculation for the descrambled data so as to store the result of said error detecting code calculation, and thereafter on the basis of the stored syndromes of said second series and the stored syndromes of said first series, alternately to perform the error correction of the descrambled data and to revise the stored syndromes of said second series or the stored syndromes of said first series, to revise the stored result of said error detecting code calculation.

2. A data decoding processing system claimed in claim 1 wherein whether or not the data error has been corrected is discriminated on the basis of the revised result of said error detecting code calculation.

3. A data decoding processing system claimed in claim 1 wherein said error correction of the descrambled data and the revising of the stored syndromes of said second series or the stored syndromes of said first series, to revise the stored result of said error detecting code calculation, are performed by performing the error correction of the stored descrambled data on the basis of the stored syndromes of said second series so as to revise the stored syndromes of said first series and the stored result of said error detecting code calculation, and by performing the error correction of the revised descrambled data and to revise the stored result of said error detecting code calculation on the basis of the revised syndromes of said first series.

4. A data decoding processing system claimed in claim 3 wherein whether or not the data error has been corrected is discriminated on the basis of the revised result of said error detecting code calculation.

5. A data decoding processing system for decoding data which is obtained by adding two error correcting code series to a scrambled data added with error detection codes, the data decoding processing system comprising:

a demodulating means for receiving and demodulating said data;

a first buffer memory for storing the demodulated data;

a first series syndrome generating means for generating syndromes of a first series from said demodulated data;

a first error correcting means for deriving the position and the magnitude of an error in said first series from the generated syndromes of said first series, to correct said data in said first buffer memory on the basis of the position and the magnitude of the error;

a first series syndrome storing memory for receiving and storing the syndromes of said first series after error corrected, from said first error correcting means;

a second series syndrome generating means for generating syndromes of a second series from data read out from said first buffer memory;

a descrambling/error correcting code calculating means for descrambling said data read out from said first buffer memory and for performing an error correcting code calculation for the descrambled data;

a second buffer memory for storing said descrambled data;

an error correcting code calculation result storing memory for storing the result of said error correcting code calculation;

a second error correcting means, for deriving the position and the magnitude of an error in said second series from the generated syndromes of said second series, to correct an error in the data in said second buffer memory, to revise said syndrome of said first series stored in said first series syndrome storing memory, and to revise the result of said error correcting code calculation stored in said error correcting code calculation result storing memory, on the basis of the position and the magnitude of the error thus derived, said second error correcting means further reading out the revised syndrome of said first series stored in said first series syndrome storing memory to derive the position and the magnitude of an error in said first series from the read-out revised syndrome of said first series and to revise the data in said second buffer memory and to further revise the revised result of said error correcting code calculation, on the basis of the position and the magnitude of the error thus derived in said first series; and a discriminating means for discriminating whether or not the revised result of said error correcting code calculation stored in said error correcting code calculation result storing memory has become all-zero.

6. A data decoding processing method for decoding data which is obtained by adding two error correcting code series to a scrambled data added with error detection codes, the data decoding processing method including the steps of:

generating syndromes of a first series from said data, to perform an error correction of said data on the basis of the generated syndromes of said first series, and to store said syndromes of said first series after the error correction;

generating and storing syndromes of a second series from the error corrected data, and simultaneously descrambling the error corrected data so as to store the descrambled data, and to perform an error detecting code calculation for the descrambled data so as to store the result of said error detecting code calculation; and thereafter on the basis of the stored syndromes of said second series and the stored syndromes of said first series, alternately performing the error correction of the descrambled data, and revising the stored syndromes of said second series or the stored syndromes of said first series, to revise the stored result of said error detecting code calculation.

7. A data decoding processing method claimed in claim 6 further including the step of discriminating, on the basis of the revised result of said error detecting code calculation, whether or not the data error has been corrected.

8. A data decoding processing method claimed in claim 6 wherein said steps of alternately performing the error correction of the descrambled data and revising the stored syndromes of said second series or the stored syndromes of said first series, to revise the stored result of said error detecting code calculation, include to perform the error correction of the stored descrambled data on the basis of the stored syndromes of said second series so as to revise the stored syndromes of said first series and the stored result of said error detecting code calculation, and to perform the error correction of the revised descrambled data and to revise the stored result of said error detecting code calculation on the basis of the revised syndromes of said first series.

9. A data decoding processing method claimed in claim 8 further including the step of discriminating, on the basis of the revised result of said error detecting code calculation, whether or not the data error has been corrected.

10. A data decoding processing method for decoding data which is obtained by adding two error correcting code series to a scrambled data added with error detection codes, the data decoding processing method including the steps of:

receiving and demodulating said data;

storing the demodulated data in a first buffer memory;

generating syndromes of a first series from said demodulated data;

deriving the position and the magnitude of an error in said first series from the generated syndromes of said first series, to correct said data in said first buffer memory on the basis of the position and the magnitude of the error;

transferring and storing the syndromes of said first series after error corrected, in a first series syndrome storing memory;

generating syndromes of a second series from data read out from said first buffer memory;

descrambling said data read out from said first buffer memory and performing an error correcting code calculation for the descrambled data;

storing said descrambled data in a second buffer memory;

storing the result of said error correcting code calculation in an error correcting code calculation result storing memory;

deriving the position and the magnitude of an error in said second series from the generated syndromes of said second series, to correct an error in the data in said second buffer memory, to revise said syndrome of said first series stored in said first series syndrome storing memory, and to revise the result of said error correcting code calculation stored in said error correcting code calculation result storing memory, on the basis of the position and the magnitude of the error thus derived, further reading out the revised syndrome of said first series stored in said first series syndrome storing memory to derive the position and the magnitude of an error in said first series from the read-out revised syndrome of said first series and to revise the data in said second buffer memory and to further revise the revised result of said error correcting code calculation, on the basis of the position and the magnitude of the error thus derived in said first series; and discriminating whether or not the revised result of said error correcting code calculation stored in said error correcting code calculation result storing memory has become all-zero.

* * * * *